(12) United States Patent
He et al.

(10) Patent No.: US 12,316,284 B2
(45) Date of Patent: May 27, 2025

(54) MULTI-FREQUENCY LOW NOISE AMPLIFIER

(71) Applicant: SMARTER MICROELECTRONICS (GUANG ZHOU) CO., LTD., Guangzhou (CN)

(72) Inventors: Minjun He, Guangzhou (CN); Yaohua Zheng, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 522 days.

(21) Appl. No.: 17/929,708

(22) Filed: Sep. 4, 2022

(65) Prior Publication Data

US 2022/0416732 A1 Dec. 29, 2022

Related U.S. Application Data

(63) Continuation of application No. PCT/CN2021/131169, filed on Nov. 17, 2021.

(30) Foreign Application Priority Data

Feb. 18, 2021 (CN) .......................... 202110187442.1

(51) Int. Cl.
*H03F 3/191* (2006.01)
*H03F 1/26* (2006.01)
(Continued)

(52) U.S. Cl.
CPC .............. *H03F 1/565* (2013.01); *H03F 1/26* (2013.01); *H03F 3/195* (2013.01);
(Continued)

(58) Field of Classification Search
CPC ...................................................... H03F 3/191
(Continued)

(56) References Cited

U.S. PATENT DOCUMENTS

2018/0248526 A1 8/2018 Lee et al.

FOREIGN PATENT DOCUMENTS

| CN | 104035105 A | 9/2014 |
| CN | 203930070 U | 11/2014 |

(Continued)

OTHER PUBLICATIONS

China first office action in Application No. 202110187442.1, mailed on Apr. 9, 2014.

(Continued)

*Primary Examiner* — Henry Choe
(74) *Attorney, Agent, or Firm* — Syncoda LLC; Feng Ma

(57) ABSTRACT

A multi-frequency low noise amplifier includes an input matching network, an amplifying circuit and an output matching network. The input matching network includes a first out-of-band rejection circuit and a first frequency band selection circuit. The output matching network includes a second out-of-band rejection circuit and a second frequency band selection circuit. The first out-of-band rejection circuit can reject signal of any frequency band in the radio frequency signals so that signals of the remaining frequency bands can pass through. The first frequency band selection circuit can screen out the signals of reference frequency spots from the remaining frequency bands. The second frequency band selection circuit can screen out the signals of partial frequency spots from the amplified signals of reference frequency spots. The second out-of-band rejection circuit can reject the signal of any frequency spot in the signals of partial frequency spots.

8 Claims, 2 Drawing Sheets

(51) Int. Cl.
*H03F 1/56* (2006.01)
*H03F 3/195* (2006.01)

(52) U.S. Cl.
CPC .. *H03F 2200/111* (2013.01); *H03F 2200/294* (2013.01); *H03F 2200/451* (2013.01)

(58) Field of Classification Search
USPC .................................................. 330/302, 305
See application file for complete search history.

(56) References Cited

FOREIGN PATENT DOCUMENTS

| | | |
|---|---|---|
| CN | 105210291 A | 12/2015 |
| CN | 110495096 A | 11/2019 |
| CN | 112564645 A | 3/2021 |
| WO | 2006047294 A1 | 5/2006 |

OTHER PUBLICATIONS

International Search Report and written opinion in Application No. PCT/CN2021/131169, mailed on Feb. 9, 2022.
China Notification to Grant Patent Right for Invention in Application No. 202110187442.1, mailed on May 6, 2021.

MULTI-FREQUENCY LOW NOISE AMPLIFIER

CROSS-REFERENCE TO RELATED APPLICATIONS

This is a continuation of International Application No. PCT/CN2021/131169 filed on Nov. 17, 2021, which claims priority to Chinese Patent Application No. 202110187442.1 filed on Feb. 18, 2021. The disclosures of the above-referenced applications are hereby incorporated by reference in their entirety.

BACKGROUND

With the development of mobile communication technologies, a mobile terminal may be required to support multi-frequency band and multi-channel operation, which makes radio frequency transceiver in the mobile terminal more and more complicated.

SUMMARY

The disclosure relates to the technical field of circuit, relating to but not limited to a multi-frequency low noise amplifier.

Various embodiments of the disclosure provide a multi-frequency low noise amplifier, which realizes the multi-band support function with the single low noise amplifier. The circuit structure also has an out-of-band rejection function, and the circuit is easy to realize and beneficial to be integrated, and saves the chip area. At the same time, each frequency band is optimized targeting to realize optimal noise figures, gain, linearity and so on.

In an aspect, a multi-frequency low noise amplifier, which comprises an input matching network, an amplifying circuit and an output matching network. Herein, the input matching network comprises a first out-of-band rejection circuit and a first frequency band selection circuit, and the output matching network includes a second out-of-band rejection circuit and a second frequency band selection circuit.

An input end of the first out-of-band rejection circuit is connected with a radio frequency input end, and an output end of the first out-of-band rejection circuit is connected with an input end of the first frequency band selection circuit.

An output end of the first frequency band selection circuit is connected with an input end of the amplifying circuit.

An output end of the amplifying circuit is connected with an input end of the second frequency band selection circuit, and an output end of the second frequency band selection circuit is connected with a radio frequency output end.

One end of the second out-of-band rejection circuit is connected with the second frequency band selection circuit, and another end of the second out-of-band rejection circuit is connected with the grounded junction.

The first out-of-band rejection circuit can reject signals of any frequency band in the radio frequency signals so that signals of remaining frequency bands can pass through. The first frequency band selection circuit can screen out signals of reference frequency spots from the remaining frequency bands. The second frequency band selection circuit can screen out signals of partial frequency spots from the amplified signals of the reference frequency spots. The second out-of-band rejection circuit can reject the signal of any frequency spot in the signals of the partial frequency spots, so that the multi-frequency low noise amplifier can output the signal of target frequency spot.

In some embodiments, the first out-of-band rejection circuit includes a plurality of first branches arranged in parallel, in which each of the first branches include a first variable capacitor and a first inductor arranged in series; one end of the first branch is connected with the radio frequency input end, and another end of the first branch is connected with the grounded junction.

In some embodiments, the first frequency band selection circuit includes a plurality of second branches arranged in series, and each of the second branches includes a second variable capacitor and a second inductor arranged in parallel.

In some embodiments, the second frequency band selection circuit includes a third inductor, a third variable capacitor and a fourth variable capacitor which are arranged in series.

One end of the third inductor is connected with an output end of the amplifying circuit, and another end of the third inductor is connected with a power end.

One end of the third variable capacitor is connected with the output end of the amplifying circuit, and another end of the third variable capacitor is connected with the fourth variable capacitor.

One end of the fourth variable capacitor is connected with the third variable capacitor, and another end of the fourth variable capacitor is connected with the radio frequency output end.

In some embodiments, the second out-of-band rejection circuit includes a fourth inductor and a fifth variable capacitor arranged in series.

In some embodiments, one end of the second out-of-band rejection circuit is connected with the second frequency band selection circuit, and another end of the second out-of-band rejection circuit is connected with the ground junction.

Particularly, one end of the fourth inductor is connected between the third variable capacitor and the fourth variable capacitor, and another end of the fourth inductor is connected with the fifth variable capacitor.

One end of the fifth variable capacitor is connected with the fourth inductor, and another end of the fifth variable capacitor is connected with the ground junction.

In some embodiments, a sixth capacitor is arranged between the radio frequency input end and the first branches, and the sixth capacitor can isolate a direct current of an external circuit of the radio frequency input end.

Various embodiments of the disclosure also provide a radio frequency chip integrated with the above multi-frequency low noise amplifier.

Various embodiments of the disclosure further provide an electronic device integrated with the above multi-frequency low noise amplifier.

The multi-frequency low noise amplifier, radio frequency and electronic device provided by the embodiment of the disclosure include an input matching network, an amplifying circuit and an output matching network. The input matching network includes a first out-of-band rejection circuit and a first frequency band selection circuit. The output matching network includes a second out-of-band rejection circuit and a second frequency band selection circuit.

An input end of the first out-of-band rejection circuit is connected with a radio frequency input end, and an output end of the first out-of-band rejection circuit is connected with an input end of the first frequency band selection circuit. An output end of the first frequency band selection circuit is connected with an input end of the amplifying circuit. An output end of the amplifying circuit is connected with an input end of the second frequency band selection circuit, and an output end of the second frequency band selection circuit is connected with a radio frequency output end.

One end of the second out-of-band rejection circuit is connected with the second frequency band selection circuit, and another end of the second out-of-band rejection circuit is connected with a grounded junction. Herein, the first out-of-band rejection circuit can reject signals of any frequency band in radio frequency signals so that signals of remaining frequency bands can pass through; the first frequency band selection circuit can screen out signals of reference frequency spots from the remaining frequency bands; the second frequency band selection circuit can screen out the signals of partial frequency spots from the amplified signals of reference frequency spots; the second out-of-band rejection circuit can reject the signal of any frequency spot in the signals of the partial frequency spots, so that the multi-frequency low noise amplifier can output signal of target frequency spot.

In this way, the problem that the scheme using the wide-band low noise amplifier can only make the signal of a certain continuous wide frequency band amplified, and it is difficult to realize the optimal performance such as gain and noise figure, is solved.

At the same time, it also solves the problem, caused by the using the scheme of providing an independent narrowband low noise amplifier for each frequency band respectively, that the number of components is large, which is not conducive to integration and have a high cost, and the access type of the filters becomes complicated when there are many rejected frequency bands, which increases the complexity and the debugging difficulty of the system, and also brings extra insertion loss and worsens noise.

The multi-frequency low noise amplifier realizes the multi-band support function with a single low noise amplifier. It also has an out-of-band rejection function in the circuit structure, the circuit is easy to realize and beneficial to be integrated, and saves the chip area. At the same time, each frequency band is optimized targeting to realize optimal noise figures, gain, linearity and so on.

DETAILED DESCRIPTION

Figure 1:
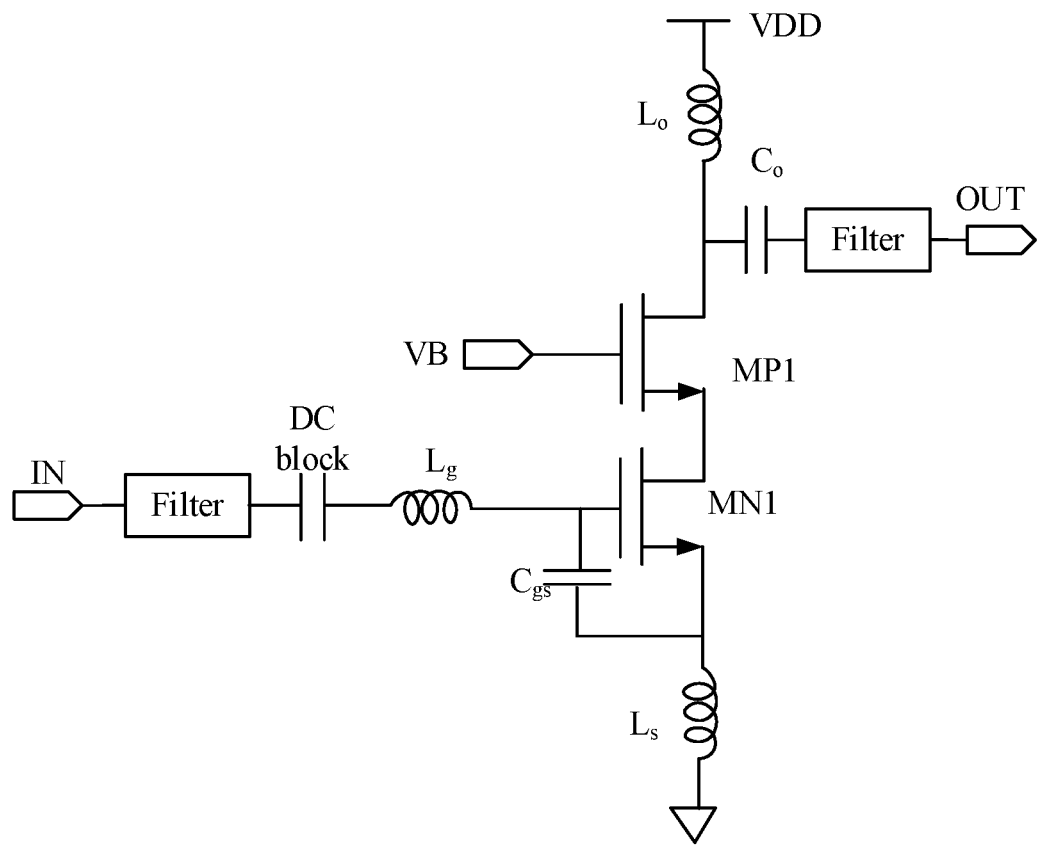
FIG. 1 is a circuit diagram of a narrowband low noise amplifier of some implementations.

In order to enable those skilled in the art better understand the scheme of this disclosure, the technical scheme in the embodiments of this disclosure will be clearly and completely described with reference to the drawings in the embodiments of this disclosure. Apparently, the described embodiments are only a part of embodiments of this disclosure, not all of embodiments. Based on the embodiments of this disclosure, all other embodiments obtained by ordinary those skilled in the art without creative works are within the scope of protection of this disclosure. In order to make the purpose, technical scheme and advantages of the embodiments of this disclosure clearer, the specific technical scheme of this disclosure will be described in further detail below with reference to the drawings in the embodiments of this disclosure. The following embodiments are used to illustrate the disclosure, but not to limit the scope of the disclosure.

The terms "first" and "second" in the description and claims of this disclosure and the above drawings are used to distinguish different objects, not to describe a specific order. Furthermore, the terms "comprise" and "have" and any variation thereof are intended to cover non-exclusive inclusion. For example, processes, methods, system, products or equipment including a series of steps or units are not limited to the listed steps or units, and optionally include steps or units that are not listed or optionally include other steps or units inherent to these processes, methods, products or equipment.

The "embodiment" referred herein means that the particular feature, structure or characteristic described in combination with the embodiment may be included in at least one embodiment of the disclosure. The word occurring in various places in the description does not necessarily refer to the same embodiment, nor is it an independent or alternative embodiment mutually exclusive with other embodiments. It is understood explicitly and implicitly by those skilled in the art that the embodiments described herein can be combined with other embodiments.

A Low Noise Amplifier (LNA) is used as a preamplifier of the radio frequency transceiver for receiving radio frequency signals of multiple frequency bands, and a broadband low noise amplifier is often used to amplify the signals of multiple frequency bands. However, the broadband low noise amplifier can only amplify certain continuous broadband signals, and it is difficult to achieve optimal gain, noise figures and other performances.

For example, in the wireless communication application, a low noise amplifier is an active network, which is used to amplify weak radio frequency (RF) signals, so that a receiver can process them. In the receiving chain, the first amplifier arranged after the antenna has the greatest influence on the system noise figure. Any amplifier produces extra noise and distortion to the ideal signal. However, an RF low noise amplifier (RF LNA) increases the amplitude of the required radio frequency signal on the premise of not adding distortion and noise as much as possible.

The low noise amplifier is generally used as the preamplifier of various radio receivers or the amplifying circuit of high-sensitivity electronic detection equipment. In the process of transmission, the radio frequency signals are reflected due to the instantaneous impedance change of transmission lines, and the reflected signals will be aliased with the original radio frequency signals, and thus affect the quality of the radio frequency signals. At the same time, the noise of electronic components themselves also affects the quality of radio frequency signals. Therefore, before the radio frequency signals are input into a radio frequency signal amplification circuit for signal amplification, or before an amplified radio frequency signals are output, a matching network should be set to achieve better gain, linearity and noise factor. In the working process of the low noise amplifier, the matching network is required to have a certain frequency band selection ability and the ability to reject other frequency bands, especially adjacent frequency bands, otherwise the large signals received by adjacent frequency bands will cause gain compression and intermodulation distortion of the low noise amplifier, which affects the demodulation of useful signals.

At present, for common practice of amplifying the received multi-band radio frequency signals by low noise amplifier, it is also proposed to equip each band with an independent narrow-band low noise amplifier, besides using the wide-band low noise amplifier to amplify the received multi-band radio frequency signals. F FIG. 1 is the circuit diagram of a narrow-band low noise amplifier in some implementations. In FIG. 1, the circuit structure of the narrow-band low noise amplifier includes: an input matching network consisting of inductor $L_g$, common-source tube parasitic capacitor $C_{gs}$ and source degeneration inductor $L_s$ connected in series; an output matching network consisting of inductor $L_o$ and capacitor $C_o$ connected in series; an amplifier tube consisting of a common gate tube MP1 and a common source tube MN1 connected in series; and a DC block. In the process of amplification, a plurality of narrow-band low noise amplifiers are selected and used, and the radio frequency signals are screened and amplified at the radio frequency input end IN after the radio frequency are acquired by IN, and are output through the radio frequency output end OUT It should be noted that each narrowband low noise amplifier is usually connected with one off-chip filter in the input-output matching network, and the off-chip filter is used to reject signals in other frequency bands.

For each narrowband low noise amplifier, the radio frequency signals are reflected due to the instantaneous impedance change of the transmission line during transmission, and the reflected signals alias with the original radio frequency signals, thereby affecting the quality of the radio frequency signals. At the same time, the noise of electronic components themselves also affects the quality of radio frequency signals. Therefore, input/output impedance matching is required before the radio frequency signals are input to the amplifier circuit for signal amplification or before the amplified radio frequency signals are output. The input impedance $Z_{in}$ of the input matching network in the narrowband low noise amplifier shown in FIG. 1 is determined by the following formula (1):

$$Z_{in} = j\omega L_g + \frac{1}{j\omega C_{gs}} + \frac{g_m L_s}{C_{gs}}, \quad (1)$$

wherein, $g_m$ is the transconductance of MN1, and $\omega$ is the angular frequency. According to formula (1), in order to realize the input matching of the given impedance $Z_o$, it is firstly necessary to select an appropriate value of $L_s$ to make $$\frac{g_m L_s}{C_{gs}}$$

equal to the real part of the given impedance $Z_o$. Then, the value of $L_g$ is selected to make that the resonant frequency of $L_g$ and $C_{gs}$ is equal to the working frequency of the input matching network in the low noise amplifier, and finally it is obtained that the given impedance $Z_o$ is conjugate to the input impedance $Z_{in}$, thereby completing the input impedance matching of the low noise amplifier. Because the conjugate of $Z_o$ and $Z_{in}$ can only be established at a certain frequency spot, this input impedance matching is suitable for narrowband low noise amplifiers.

For the output matching network of the narrowband low noise amplifier shown in FIG. 1, an appropriate value of the inductor $L_o$ is firstly selected to make the resonant frequency of the inductor $L_o$ and the capacitor $C_o$ equal to the working frequency of the output matching network in the narrowband low noise amplifier, so as to complete the output matching of the low noise amplifier to ensure gain and noise figure to be optimal. It can be seen that the output matching network of the narrowband low noise amplifier can achieve the output matching only at the resonant frequency point of $L_o$ and $C_o$.

From the above, it can be seen that when narrowband low noise amplifiers are used to amplify signals of multiple frequency bands, the number of narrowband low noise amplifiers is directly proportional to the number of frequency bands. For received signals of multiple frequency bands, this method leads to a large number of components, which is not conducive to integration and has a high cost. At the same time, as off-chip filters are introduced into the narrowband LNAs, when there are many rejected frequency bands, the access type of the filters becomes complicated, and the number of filters is also proportional to that of the narrowband LNA, therefore accessing off-chip filters increases the complexity and the debugging difficulty of the system, and further brings extra insertion loss and worsens noise.

Figure 2:
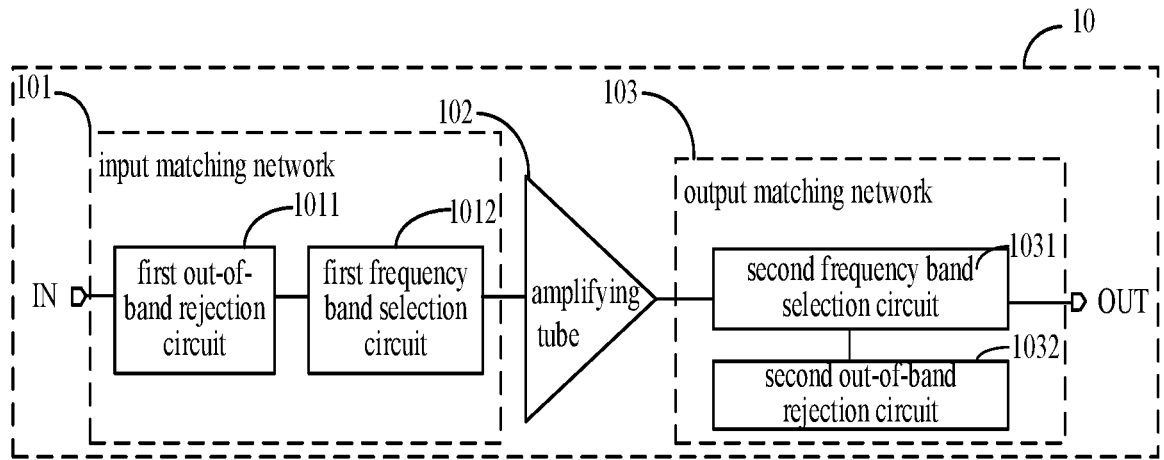
FIG. 2 is a schematic structural diagram of an optional multi-frequency low noise amplifier provided by an embodiment of this disclosure.

FIG. 2 is a schematic structural diagram of an optional multi-frequency low noise amplifier 10 provided by an embodiment of this disclosure. As shown in FIG. 2, the multi-frequency low noise amplifier 10 includes an input matching network 101, an amplifying circuit 102 and an output matching network 103; in which the input matching network 101 includes a first out-of-band rejection circuit 1011 and a first frequency band selection circuit 1012; and the output matching network 103 includes a second frequency band selection circuit 1031 and a second out-of-band rejection circuit 1032.

The input end of the first out-of-band rejection circuit 1011 is connected with the radio frequency input end IN. The output end of the first out-of-band rejection circuit 1011 is connected to the input end of the first frequency band selection circuit 1012. The output end of the first frequency band selection circuit 1012 is connected to the input end of the amplifying circuit 102. The output end of the amplifying circuit 102 is connected to the input end of the second frequency band selection circuit 1031. The output end of the second frequency band selection circuit 1031 is connected with the radio frequency output end OUT. One end of the second out-of-band rejection circuit 1032 is connected to the second frequency band selection circuit 1031, and the other end of the second out-of-band rejection circuit 1032 is connected to the grounded junction.

The first out-of-band rejection circuit 1011 can reject signals of any frequency band in the radio frequency signals so that signals of the remaining frequency bands can pass through. The first frequency band selection circuit 1012 can screen out the signals of reference frequency spots from the remaining frequency bands. The second frequency band selection circuit 1031 can screen out the signals of partial frequency spots from the amplified signals of the reference frequency spots. The second out-of-band rejection circuit 1032 can reject the signal of any frequency spot in the signals of partial frequency spots, so that the multi-frequency low noise amplifier 10 can output the signals of target frequency spots.

In an embodiment of this disclosure, the radio frequency input end IN is connected with a radio frequency signal receiving device, such as an antenna, for receiving the radio frequency signal to be processed. The radio frequency output end OUT is generally connected to the next stage of circuit of the multi-frequency low noise amplifier 10, such as a mixer circuit.

In an embodiment of this disclosure, the antenna is used to support the 5th generation mobile networks (5G). There can be multiple antennas supporting the 5th generation mobile communication technology, such as four antennas, and each antenna is connected with the radio frequency input end IN.

The antennas in the embodiment of this disclosure can support the transmission and reception of multi-band radio frequency signals. Still taking the four antennas as an example, the four antennas can support the transmission and reception of radio frequency signals in a high frequency band, intermediate frequency band and low frequency band. Among the four antennas, there are antennas that support the transmission and reception of radio frequency signals in at least one frequency band. For example, the first one of the four antennas supports the low frequency band of 0.6~0.96 GHz and the intermediate and high frequency band of 1.7~2.7 GHz, and the second one of the four antennas supports the high frequency band of 3.3~5 GHz.

The multi-frequency low noise amplifier 10 provided by the embodiment of this disclosure includes the input matching network 101, the amplification tube 102 and the output matching network 103. The input matching network 101 includes the first out-of-band rejection circuit 1011 and the first frequency band selection circuit 1012. The output matching network 103 includes the second frequency band selection circuit 1031 and the second out-of-band rejection circuit 1032. The input end of the first out-of-band rejection circuit 1011 is connected with the radio frequency input end IN, and the output end of the first out-of-band rejection circuit 1011 is connected with the input end of the first frequency band selection circuit 1012. The output end of the first frequency band selection circuit 1012 is connected to the input end of the amplifying circuit 102. The output end of the amplifying circuit 102 is connected to the input end of the second frequency band selection circuit 1031, and the output end of the second frequency band selection circuit 1031 is connected with the radio frequency output end OUT. One end of the second out-of-band rejection circuit 1032 is connected to the second frequency band selection circuit 1031, and the other end of the second out-of-band rejection circuit 1032 is connected to the grounded junction. The first out-of-band rejection circuit 1011 can reject the signal of any frequency band in the radio frequency signals so that signals of the remaining frequency bands can pass through. The first frequency band selection circuit 1012 can screen out the signals of reference frequency spots from the remaining frequency bands. The second frequency band selection circuit 1031 can screen out the signals of partial frequency spots from the amplified signals of the reference frequency spots. The second out-of-band rejection circuit 1032 can reject the signal of any frequency spot in the signals of partial frequency spots, so that the multi-frequency low noise amplifier 10 output the signal of target frequency spot. In this way, the problem that the scheme using the wideband low noise amplifier can only amplify the signal of a certain continuous wide frequency band and is difficult to realize the optimal performance such as gain and noise figure e, is solved. At the same time, it also solves the problem, caused by using the scheme of providing an independent narrowband low noise amplifier for each frequency band, that the number of components is large, which is not conducive to integration and have a high cost, and the access type of the filters becomes complicated when there are many rejected frequency bands, which increases the complexity and the debugging difficulty of the system, and also brings extra insertion loss and worsens noise. The multi-frequency low noise amplifier 10 realizes the multi-band support function with a single low noise amplifier. It also has the out-of-band rejection function in the circuit structure, the circuit is easy to realize and beneficial to be integrated, and saves the chip area. At the same time, each frequency band is optimized targeting to realize optimal noise figure, gain, linearity and so on.

Figure 3:
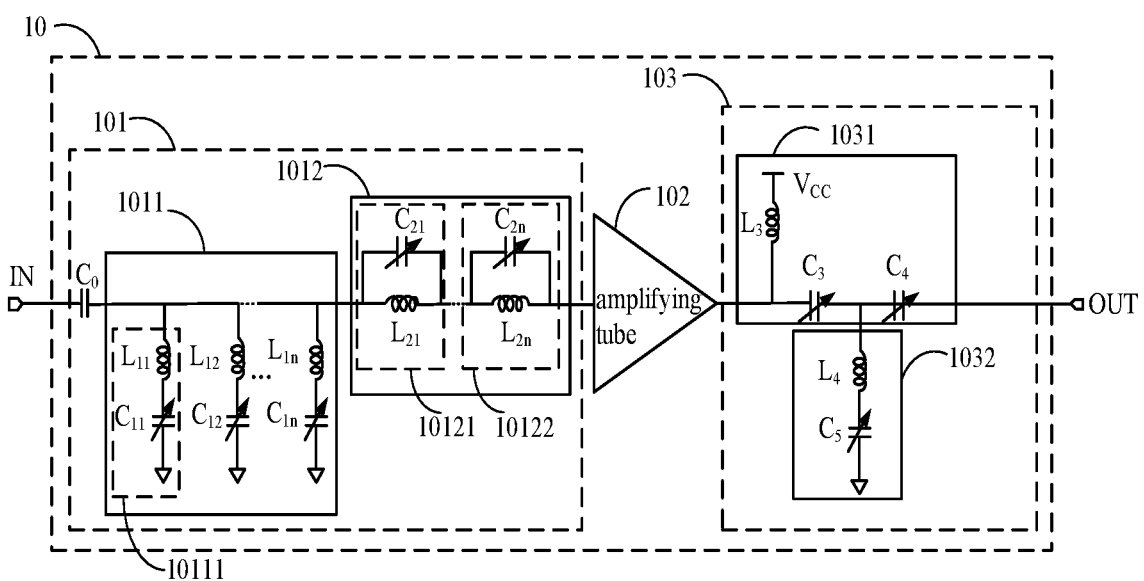
FIG. 3 is a schematic structural diagram of an optional multi-frequency low noise amplifier provided by an embodiment of this disclosure.

FIG. 3 is a schematic structural diagram of another optional multi-frequency low noise amplifier 10 provided by an embodiment of this disclosure. As shown in FIG. 3, the first out-of-band rejection circuit 1011 includes a plurality of parallel-connected first branches. The first branch includes a first variable capacitor and a first inductor arranged in series, and one end of the first branch is connected with the radio frequency input end, and the other end of the first branch is connected with the grounded junction. A sixth capacitor $C_o$ is arranged between the radio frequency input end IN and the first branches, and the sixth capacitor $C_o$ can isolate the direct current of the external circuit of the radio frequency input end IN.

In some embodiments, based on the actual demand, the capacitance of the first variable capacitor in each first branch is adjusted by the first out-of-band rejection circuit 1011 to change the resonant frequency of each first branch, so that the first out-of-band rejection circuit 1011 can reject signals of any frequency band in the radio frequency signals to make the signals of the remaining frequency bands pass through. Preferably, the resonant frequency of each of the first branches in the first out-of-band rejection circuit 1011 is respectively set to a plurality of different frequencies which the multi-frequency low noise amplifier 10 intends to reject, i.e. a low resistance is set at the resonant frequency of each first branch. If the radio frequency signals input from the radio frequency input end IN includes a frequency component of the signal of the frequencies that the multi-frequency low noise amplifier 10 intends to reject, the frequency component is directly pulled down to the ground by the low resistance set in the first out-of-band rejection circuit 1011, so that it does not enter the amplifying circuit 102. Therefore, the circuit structure has the out-of-band rejection function, the circuit is simple to realize, is beneficial to integration, and saves chip area. In addition, the first out-of-band rejection circuit 1011 can reject invalid signals in any frequency band and effectively screening out invalid signals in the radio frequency signals input to the multi-frequency low noise amplifier 10, which avoids gain compression and intermodulation distortion caused by invalid signals, reduces the influence on demodulation of useful signals, and effectively reduce the range of frequency band matching, improving the efficiency of obtaining useful signals.

The first frequency band selection circuit 1012 in this embodiment includes a plurality of second branches arranged in series. A second branch includes a second variable capacitor and a second inductor arranged in parallel connection.

The capacitance of the second variable capacitor in each second branch is adjusted and the inductance of each second branch is changed in the first frequency band selection circuit 1012 based on an actual demand, so as to adapt to the working frequency $f_0$ of the multi-frequency low noise amplifier 10. For example, if the first frequency band selection circuit 1012 only includes two second branches 10121 and 10122, when the multi-frequency low noise amplifier 10 needs to work in the high frequency of band, the second variable capacitors $C_{21}$ and $C_{2n}$ are adjusted to small capacitances. At this time, the equivalent inductance in the input matching network 101 is small, and thus the multi-frequency low noise amplifier 10 works in a high frequency of band. When the multi-frequency low noise amplifier 10 needs to work in a low frequency of band, $C_{21}$ and $C_{2n}$ are adjusted to large capacitances. At this time, the equivalent inductance in the input matching network 101 is large, and thus the multi-frequency low noise amplifier 10 works in the low frequency of band. The first frequency band selection circuit 1012 performs secondary screening on the remaining frequency bands screened by the first out-of-band rejection circuit 1011 to obtain the signals of the reference frequency spots. The reference frequency spot is the frequency spot corresponding to the working frequency $f_0$ of the input matching network 101 in the multi-frequency low noise amplifier 10.

In some embodiments, the capacitance of the second variable capacitor in each second branch is adjusted and the inductance of each second branch in the first frequency band selection circuit 1012 is changed, thereby changing the inductance in the input matching network 101 and further adapting to multiple frequency bands of the multi-frequency low noise amplifier 10. Therefore, it is realized that a single multi-frequency low noise amplifier 10 supports multi-frequency band input impedance matching.

In some embodiments, the equivalent inductance $L_{total}$ of the input matching network 101 in the multi-frequency low noise amplifier 10 depends on the equivalent inductance in the first out-of-band rejection circuit 1011 and the equivalent inductance in the first frequency band selection circuit 1012. Herein, during the normal operation of the multi-frequency low noise amplifier 10, the first out-of-band rejection circuit 1011 can be equivalently regarded as a capacitor or an inductor relative to the working frequency $f_0$ of the first frequency band selection circuit 1012. For example, the resonant frequency of the first variable capacitor $C_{11}$ and the first inductor $L_{11}$ in the first branch 10111 is $f_1$, i.e., the frequency that needs to be rejected. If $f_0 > f_1$, the first branch 10111 is equivalent to an inductor, and the equivalent inductance $L_{total}$ of the input matching network 101 is greater than the sum of the inductance of each second branch of the first frequency band selection circuit 1012. If $f_0 < f_1$, the first branch 10111 is equivalent to a capacitor, and the equivalent inductance $L_{total}$ of the input matching network 101 is less than the sum of the inductance of every second branch of the first frequency band selection circuit 1012. It should be noted that the frequency $f_0$ to be rejected and the operating frequency $f_1$ is not too different. If they were too different, a good rejection effect can be achieved even without rejection circuits. Therefore, the equivalent inductor or capacitor of each first branch in the first out-of-band rejection circuit 1011 has a small inductance or capacitance relatively.

In some embodiments, the equivalent inductor $L_{total}$ of the input matching network 101 corresponds to the inductance $L_g$ in FIG. 1. By adjusting the inductance of each second branch in the first frequency band selection circuit 1012 respectively, the equivalent inductance $L_{total}$ of the input matching network 101 is changed, and further the resonant frequency of $L_{total}$ and the parasitic capacitor C (not shown in the figure) of the amplifying circuit 102 is matched with the working frequency, thereby ensuring that the noise figure, gain and linearity of the multi-frequency low noise amplifier 10 are optimized.

The second frequency band selection circuit 1031 in the embodiment of the disclosure includes multiple branches, each of the branches comprises a third inductor $L_3$ a third variable capacitor $C_3$ and a fourth variable capacitor $C_4$ arranged in series. One end of the third inductor $L_3$ is connected with the output end of the amplifying circuit 102, and the other end of the third inductor $L_3$ is connected with the power end VCC.

One end of the third variable capacitor $C_3$ is connected with the output end of the amplifier tube 102, and the other end of the third variable capacitor $C_3$ is connected with the fourth variable capacitor $C_4$.

One end of the fourth variable capacitor $C_4$ is connected with the third variable capacitor $C_3$, and the other end of the fourth variable capacitor $C_4$ is connected with the radio frequency output end OUT.

Based on an actual demand, the capacitance of the third variable capacitor $C_3$ and/or the capacitance of the fourth variable capacitor $C_4$ in the second frequency band selection circuit 1031 are adjusted in the second frequency band selection circuit 1031 to change the inductance of the second frequency band selection circuit 1031, so that the resonant frequency of the second frequency band selection circuit 1031 is equal to the working frequency $f_2$ of the output matching network 103, achieving screening out the signals of partial frequency spots from the amplified signals of the reference frequency spots, completing the output impedance matching of multiple frequency band supported by the single multi-frequency low noise amplifier 10. Herein, the signals of partial frequency spots are signals corresponding to the working frequency of the output matching network 103.

In some embodiments, the equivalent inductance $L_{out}$ of the output matching network 103 in the multi-frequency low noise amplifier 10 is related to the equivalent inductance of the second band selection circuit 1031 and the equivalent inductance of the second out-of-band rejection circuit 1032. Herein, during the normal operation of the multi-frequency low noise amplifier 10, the second out-of-band rejection circuit 1032 can be equivalently regarded as a capacitor or an inductor according to the frequency $f_3$ that the second out-of-band rejection circuit 1032 intends to reject relative to the working frequency $f_2$ corresponding to partial frequency spots screened by the second frequency band selection circuit 1031. For example, the resonant frequency of the fifth variable capacitor $C_5$ and the fourth inductor $L_4$ in the second out-of-band rejection circuit 1032 is $f_3$, i.e., the frequency that the output matching network 103 needs to reject. If $f_2 > f_3$, the second out-of-band rejection circuit 1032 is equivalent to an inductor, and the equivalent inductance $L_{out}$ of the output matching network 103 is greater than the sum of the inductance of the third variable capacitor $C_3$ and the inductance of the fourth variable capacitor $C_4$ in the second frequency band selection circuit 1031. If $f_2 < f_3$, the second out-of-band rejection circuit 1032 is equivalent to a capacitor, and the equivalent inductance $L_{out}$ of the output matching network 103 is less than the sum of the inductance of the third variable capacitor $C_3$ and the inductance of the fourth variable capacitor $C_4$ in the second frequency band selection circuit 1031. It should be noted that, $f_2$ and $f_3$ do not differ too much. If the difference is large, the good rejection effect can be achieved even without rejection circuits. Therefore, the equivalent inductance or capacitance of the second out-of-band rejection circuit 1032 is relatively small.

The second out-of-band rejection circuit 1032 in the embodiment of the disclosure includes the fourth inductor $L_4$ and the fifth variable capacitor $C_5$ arranged in series.

In the embodiment of the disclosure, one end of the second out-of-band rejection circuit 1032 is connected with the second frequency band selection circuit 1031, and the other end of the second out-of-band rejection circuit 1032 is connected with the grounded junction.

One end of the fourth inductor $L_4$ is connected between the third variable capacitor $C_3$ and the fourth variable capacitor $C_4$, and the other end of the fourth inductor $L_4$ is connected with the fifth variable capacitor $C_5$.

One end of the fifth variable capacitor $C_5$ is connected with the fourth inductor $L_4$, and the other end of the fifth variable capacitor $C_5$ is connected with the grounded junction.

In some embodiments, based on actual requirements, the capacitance of the fifth variable capacitor $C_5$ is adjusted in the second out-of-band rejection circuit 1032, to change the resonant frequency of the second out-of-band rejection circuit 1032 itself, thereby realizing the rejection of signal of specific frequency spot. Herein, the signal of specific frequency spot is the signal which is generated during the operation of the amplifier and can affect the target frequency spot.

In some embodiments, the resonant frequency of the second out-of-band rejection circuit 1032 is set to the frequency corresponding to a specific frequency spot, that is, a low resistance is provided at the resonant frequency of the second out-of-band rejection circuit 1032. If part of the amplified frequency signals contains the frequency component of the signal of the specific frequency spot, the frequency component will be directly pulled down to the ground by the low resistance set in the second out-of-band rejection circuit 1032, and thus does not enter the next stage of the circuit. In this way, the circuit structure has the out-of-band rejection function, and the circuit is simple to realize and beneficial to integration, and can save chip area. At the same time, the second out-of-band rejection circuit 1032 can reject invalid signal in any frequency band, effectively screening out invalid signal in some amplified frequency spot signals, which avoids gain compression and intermodulation distortion caused by invalid signals, and reduces the influence on demodulation of useful signals.

In several embodiments provided in this disclosure, it should be understood that the disclosed equipment can be realized in other ways. The embodiments of device described above are only schematic, for example, the division of the unit is only a logical function division, and there may be other ways of division in actual implementation, for example, multiple units or modules can be combined or integrated into another system, or some features can be ignored or not implemented. In addition, the coupling, direct coupling or communication connection between the constituent parts shown or discussed may be indirect coupling or communication connection by some interfaces, devices or units, and may be electrical, mechanical or other forms.

The units described as separated parts may or may not be physically separated, and the parts shown as units may or may not be physical units, that is, they may be located in one position or distributed to multiple network units. Some or all units can be selected according to actual needs to achieve the purpose of this embodiment.

In addition, all functional units in each embodiment of this disclosure may be integrated in one processing module, or each unit may be used as a unit separately, or two or more units can be integrated in one unit. The above-mentioned integrated units can be implemented in the form of hardware or functional units of hardware plus software.

The multi-frequency low noise amplifier provided by the embodiment of the disclosure includes an input matching network, an amplification tube and an output matching network. The input matching network includes a first out-of-band rejection circuit and a first frequency band selection circuit. The output matching network includes a second out-of-band rejection circuit and a second frequency band selection circuit. An input end of the first out-of-band rejection circuit is connected with a radio frequency input end, and an output end of the first out-of-band rejection circuit is connected with an input end of the first frequency band selection circuit.

An output end of the first frequency band selection circuit is connected with an input end of the amplifying circuit. An output end of the amplifying circuit is connected with an input end of the second frequency band selection circuit, and an output end of the second frequency band selection circuit is connected with a radio frequency output end. One end of the second out-of-band rejection circuit is connected with the second frequency band selection circuit, and another end of the second out-of-band rejection circuit is connected with a grounded junction.

Herein, the first out-of-band rejection circuit can reject signals of any frequency band in radio frequency signals so that signals of remaining frequency bands can pass through; the first frequency band selection circuit can screen out signals of reference frequency spots from the remaining frequency bands; the second frequency band selection circuit can screen out the signals of partial frequency spots from the amplified signals of reference frequency spots; the second out-of-band rejection circuit can reject the signal of any frequency spot in the signals of the partial frequency spots, so that the multi-frequency low noise amplifier can output signals of target frequency spots.

In this way, the problem that only the signal of a certain continuous broadband band can be amplified and it is difficult to realize the optimal performance such as gain and noise figure for the scheme when using the wideband low noise amplifier, is solved.

At the same time, it also solves the problem, caused by the scheme of providing an independent narrowband low noise amplifier for each frequency band respectively, that the number of components is large, which is not conducive to integration and have a high cost, and the access type of the filters becomes complicated when there are many rejected frequency bands, which increases the complexity and the debugging difficulty of the system, and also brings extra insertion loss and worsens noise, is also solved. The multi-frequency low noise amplifier realizes the multi-band support function with a single low noise amplifier. The circuit structure also has an out-of-band rejection function, and the circuit is easy to realize and beneficial to be integrated, and saves the chip area. At the same time, each frequency band is optimized targeting to realize optimal noise figures, gain, linearity and so on.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. A multi-frequency low noise amplifier, comprising an input matching network, an amplifying circuit, and an output matching network, wherein the input matching network comprises a first out-of-band rejection circuit and a first frequency band selection circuit; and the output matching network comprises a second out-of-band rejection circuit and a second frequency band selection circuit;

an input end of the first out-of-band rejection circuit is connected with a radio frequency input end, and an output end of the first out-of-band rejection circuit is connected with an input end of the first frequency band selection circuit;

an output end of the first frequency band selection circuit is connected with an input end of the amplifying circuit;

an output end of the amplifying circuit is connected with an input end of the second frequency band selection circuit, and an output end of the second frequency band selection circuit is connected with a radio frequency output end;

one end of the second out-of-band rejection circuit is connected with the second frequency band selection circuit, and another end of the second out-of-band rejection circuit is connected with a grounded junction;

the first out-of-band rejection circuit comprises a plurality of first branches arranged in parallel, and each of the first branches comprises a first variable capacitor and a first inductor arranged in series;

the first frequency band selection circuit comprises a plurality of second branches arranged in series, and each of the second branches comprises a second variable capacitor and a second inductor arranged in parallel;

the second frequency band selection circuit comprises a third inductor, a third variable capacitor and a fourth variable capacitor which are arranged in series;

the second out-of-band rejection circuit comprises a fourth inductor and a fifth variable capacitor which are arranged in series;

the first out-of-band rejection circuit is configured to reject signal of any frequency band in radio frequency signals such that signals of remaining frequency bands are enabled to pass through;

the first frequency band selection circuit is configured to screen out signals of reference frequency spots from the remaining frequency bands;

the second frequency band selection circuit is configured to screen out signals of partial frequency spots from the amplified signals of the reference frequency spots; and the second out-of-band rejection circuit is configured to reject the signal of any frequency spot in the signals of the partial frequency spots, such that the multi-frequency low noise amplifier is enabled to output a signal of target frequency spot.

2. The multi-frequency low noise amplifier according to claim 1, wherein one end of each of the first branches is connected with the radio frequency input end, and another end of each of the first branches is connected with the grounded junction.

3. The multi-frequency low noise amplifier according to claim 1, wherein one end of the third inductor is connected with the output end of the amplifying circuit, and another end of the third inductor is connected with a power end;

one end of the third variable capacitor is connected with the output end of the amplifying circuit, and another end of the third variable capacitor is connected with the fourth variable capacitor; and one end of the fourth variable capacitor is connected with the third variable capacitor, and another end of the fourth variable capacitor is connected with the radio frequency output end.

4. The multi-frequency low noise amplifier according to claim 1, wherein one end of the second out-of-band rejection circuit is connected with the second frequency band selection circuit, and another end of the second out-of-band rejection circuit is connected with the grounded junction, comprising:

one end of the fourth inductor is connected between the third variable capacitor and the fourth variable capacitor, and another end of the fourth inductor is connected with the fifth variable capacitor; and one end of the fifth variable capacitor is connected with the fourth inductor, and another end of the fifth variable capacitor is connected with the grounded junction.

5. The multi-frequency low noise amplifier according to claim 2, wherein a sixth capacitor is arranged between the radio frequency input end and the first branches, and the sixth capacitor is configured to isolate a direct current of an external circuit of the radio frequency input end.

6. A radio frequency chip integrated with the multi-frequency low noise amplifier of claim 1.

7. An electronic device integrated with the multi-frequency low noise amplifier of claim 1.

8. The electronic device of claim 7, wherein the multi-frequency low noise amplifier is configured to realize a multi-band support function with a single low noise amplifier, and an out-of-band rejection function, such that each frequency band is optimized targeting to realize optimal noise figures, gain, and linearity.

* * * * *